(12) United States Patent
Ringe et al.

(10) Patent No.: US 10,585,449 B1
(45) Date of Patent: Mar. 10, 2020

(54) CLOCK CIRCUITRY FOR FUNCTIONALLY SAFE SYSTEMS

(71) Applicant: Arm Limited, Cambridge (GB)

(72) Inventors: Tushar P. Ringe, Austin, TX (US); Ramamoorthy Guru Prasadh, Austin, TX (US); Amaresh Pangal, Austin, TX (US); Kishore Kumar Jagadeesha, Austin, TX (US); Mark David Werkheiser, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/248,456

(22) Filed: Jan. 15, 2019

(51) Int. Cl.
*G06F 1/04* (2006.01)
*G06F 1/10* (2006.01)
*H03L 7/099* (2006.01)

(52) U.S. Cl.
CPC .............. *G06F 1/10* (2013.01); *H03L 7/0991* (2013.01)

(58) Field of Classification Search
CPC ................................. G06F 1/10; H03L 7/0991
See application file for complete search history.

(56) References Cited

U.S. PATENT DOCUMENTS

| | | | | | |
|---|---|---|---|---|---|
| 5,307,381 | A | * | 4/1994 | Ahuja ................... | H03K 5/1508 327/156 |
| 5,430,397 | A | * | 7/1995 | Itoh ......................... | G06F 1/10 326/101 |
| 6,922,112 | B2 | * | 7/2005 | Kurd ..................... | H03K 3/0315 327/295 |
| 7,809,971 | B2 | * | 10/2010 | Shimobeppu ............. | G06F 1/10 327/156 |
| 8,710,892 | B2 | * | 4/2014 | Fujimori ................... | G06F 1/10 327/293 |

* cited by examiner

*Primary Examiner* — Kenneth B Wells
(74) *Attorney, Agent, or Firm* — Pramudji Law Group PLLC; Ari Pramudji (57) ABSTRACT

Various implementations described herein refer to an integrated circuit having a clock generator providing a clock signal. The integrated circuit may include a block having a block boundary, and the block receives the clock signal from the clock generator and provides the clock signal along a clock-tree. The integrated circuit may include a plurality of sub-blocks disposed within the block boundary of the block, and each sub-block of the plurality of sub-blocks receives the clock signal from within the block boundary of the block via the clock-tree, and diverges the clock signal into a first clock signal and a second clock signal from within a sub-block boundary of each sub-block.

26 Claims, 8 Drawing Sheets

CLOCK CIRCUITRY FOR FUNCTIONALLY SAFE SYSTEMS

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Conventional functionally-safe (FuSa) systems can have stringent safety goals in the industry. These FuSa systems typically deploy lock-step methodology where many functional units are duplicated, and the pair is executed in lock-step with temporal diversity with their outputs being checked against each other to detect faults. These systems that are designed for functional safety (FuSa) deploy fully-duplicated clocks to avoid common mode faults on the clock-tree. However, duplicated clock-trees are costly for some large systems because two independent clock-trees need to be balanced across large systems before they can logically converge at lock-step checker circuits.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various schemes and techniques for providing clock circuitry for functionally safe (FuSa) systems. For instance, the various schemes and techniques described herein provide for a clock methodology to achieve better power/area goals in systems designed to support FuSa. To overcome the deficiencies of conventional methods, various schemes and techniques described herein use a single clock-tree across the FuSa system and fork-off the clock-tree at a sub-block boundary so as to simplify clock-tree balancing. The clock safety mechanism described herein may be used to detect common mode faults on distributed and/or shared sections of the clock-tree using an asynchronous reference clock, which may assist with achieving and thus improving power/area goals for FuSa systems. In some implementations, the reference clock may be a synchronous reference clock.

Various implementations of layout schemes and techniques for providing clock circuitry for functionally safe (FuSa) systems will now be described in greater detail herein with reference to FIGS. 1A-3C.

Figure 1A:
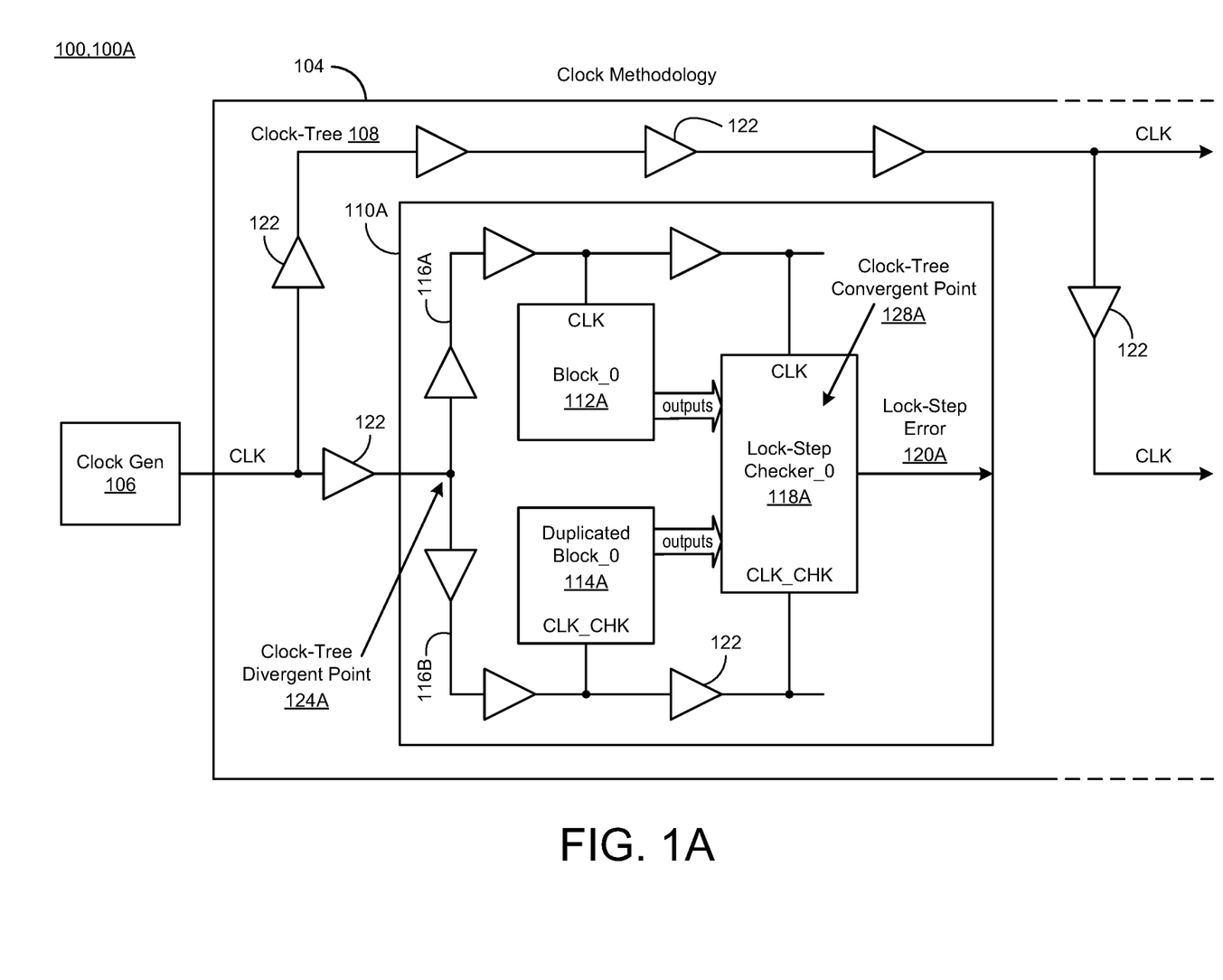
FIGS. 1A-1B illustrate a diagram of clock circuitry for functionally safe systems in accordance with various implementations described herein.
Figure 1B:
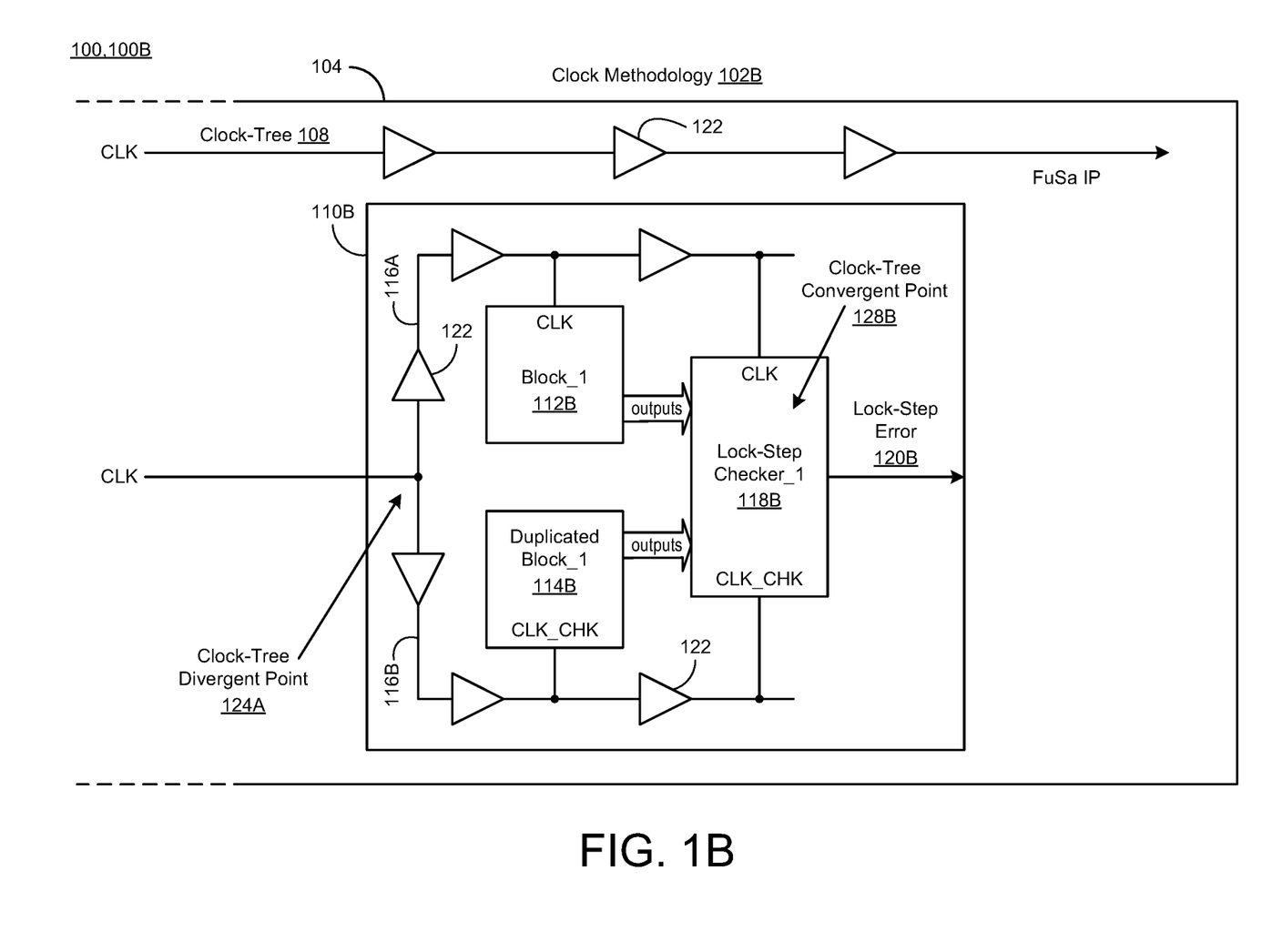

FIGS. 1A-1B illustrate a diagram of clock circuitry 100 for functionally safe (FuSa) systems in accordance with some implementations described herein. The clock circuitry 100 is split over two figures, i.e., FIG. 1A and FIG. 1B, to better illustrate the various components contained therein. In particular, FIG. 1A shows a first part 100A of the clock circuitry 100, and FIG. 1B shows a second part 100B of the clock circuitry 100 for functionally safe (FuSa) systems.

As shown in FIGS. 1A-1B, the clock circuitry 100 may be implemented as a clock methodology that achieves improved power/area goals in a system that is designed to support functional safety (FuSa). The clock circuitry 100 and the various components thereof may be fabricated and implemented as an integrated circuit (IC), and as such, the clock circuitry 100 may be integrated with various types of computing circuitry and related components on a single chip. The clock circuitry 100 may be implemented in embedded systems for various types of electronic, mobile, and/or biometric applications.

The clock circuitry 100 may include a clock generator 106 that provides a clock signal (CLK) to a block 104, such as, e.g., a functionally safe (FuSa) system, which may have a block boundary. The block 104 may receive the clock signal (CLK) from the clock generator 106 and provide the clock signal (CLK) along a clock-tree 108, which may be referred to as a main clock-tree. In this manner, the block 104 may include functional safety (FuSa) block circuitry that provides the clock signal (CLK) along the clock-tree 108 to each sub-block of the plurality of sub-blocks 110A, 110B. Also, the clock-tree 108 may be referred to as a main clock-tree that is disposed within the block boundary of the block 104, and the main clock-tree 108 feeds the clock signal (CLK) to each sub-block of the plurality of sub-blocks 110A, 110B. Also, the clock-tree 108 may include a number (N) of buffers 122 along a single path of the clock-tree 108.

As shown in FIGS. 1A-1B, the clock circuitry 100 may include a plurality of sub-blocks 110A, 110B that are disposed within the block boundary of the block 104. In some implementations, each sub-block of the plurality of sub-blocks 110A, 110B may be configured to receive the clock signal (CLK) from within the block boundary of the block 104 via the clock-tree 108. Also, each sub-block of the plurality of sub-blocks 110A, 110B may be configured to diverge the clock signal (CLK) into a first clock signal (CLK) and a second clock signal (CLK_CHK) from within a sub-block boundary of each sub-block 110A, 110B. In some instances, a point of divergence of the clock signal (CLK) may occur at the divergent node 124A, which may be referred to as a forking-off point.

As shown, each sub-block of the plurality of sub-blocks 110A, 110B may have a divergent node 124A that receives the clock signal (CLK) from within the block boundary of the block 104 via the clock-tree 108 and diverges the clock signal (CLK) into the first clock signal (CLK) and the second clock signal (CLK_CHK). Also, each sub-block of the plurality of sub-blocks 110A, 110B provides the first clock signal (CLK) along a first clock-tree 116A disposed within a sub-block boundary of each sub-block 110A, 110B. Also, each sub-block of the plurality of sub-blocks 110A, 110B provides the second clock signal (CLK_CHK) along a second clock-tree 116B disposed within the sub-block boundary of each sub-block 110A, 110B. The first clock-tree 116A and the second clock-tree 116B are separate and isolated within each sub-block of the plurality of sub-blocks 110A, 110B from the clock-tree 108 (i.e., main clock-tree) of the block 104. The first and second clock-trees 116A, 116B may include a number (N) of buffers 122 along single paths of the first and second clock-trees 116A, 116B.

In some implementations, the first clock-tree 116A may distribute the first clock signal (CLK) to first block circuitry 112A, 112B (Block_0, Block_1) disposed within each sub-block of the plurality of sub-blocks 110A, 110B, and also, the second clock-tree 116B may distribute the second clock signal (CLK_CHK) to second block circuitry 114A 114B (Duplicated Block_0, Duplicated Block_1) disposed within each sub-block of the plurality of sub-blocks 110A, 110B. In this instance, the second block circuitry 114A may be a duplicate of the first block circuitry 112A.

In some implementations, each sub-block of the plurality of sub-blocks 110A, 110B may include the first block circuitry 112A, 112B (Block_0, Block_1) and second block circuitry 114A, 114B (Duplicated Block_0, Duplicated Block_1). In this instance, the first block circuitry 112A, 112B (Block_0, Block_1) may receive the first clock signal (CLK) from the first clock-tree 116A and provide one or more first output signals (outputs) based on the first clock signal (CLK). Also, in this instance, the second block circuitry 114A, 114B (Duplicated Block_0, Duplicated Block_1) may receive the second clock signal (CLK_CHK) from the second clock-tree 116B and provide one or more second output signals (outputs) based on the second clock signal (CLK_CHK).

In some implementations, each sub-block of the plurality of sub-blocks 110A, 110B may include lock-step checker circuitry 118A, 118B (Lock-Step Checker_0, Lock-Step Checker_1) that receives the first clock signal (CLK) from the first clock-tree 116A, receives the one or more first output signals (outputs) from the first block circuitry 112A, 112B (Block_0, Block_1), receives the second clock signal (CLK_CHK) from the second clock-tree 116B, receives the one or more second output signals (outputs) from the second block circuitry 114A, 114B (Duplicated Block_0, Duplicated Block_1), and provides a lock-step error signal 120A, 120B based on the first clock signal (CLK), the one or more first output signals (outputs), the second clock signal (CLK_CHK), and the one or more second output signals (outputs).

In some implementations, the lock-step checker circuitry 118A, 118B (Lock-Step Checker_0, Lock-Step Checker_1) may operate as a logical point of convergence, and one or more faults occurring on the first clock-tree 116A within each sub-block 110A, 110B may be detected by the lock-step checker circuitry 118A, 118B. In some instances, the one or more faults may refer to a stuck-at fault that refers to a stuck-at clock error related to the clock signal (CLK) not toggling and being stuck at a logic value of one (1) or zero (0). Also, in other instances, the one or more faults may refer to a transient fault that refers to a transient clock error related to an extra edge on the clock signal (CLK) or a transient clock error related to a missed edge on the clock signal (CLK).

In some implementations, as shown in reference to FIGS. 1A-1B, the clock circuitry 100 routes the clock signal (CLK) from the clock generator 106 through the block 104 so as to feed the sub-blocks 110A, 110B. Within each of the sub-blocks 110A, 110B, the clock signal (CLK) is forked-off to create a CLK clock-tree (i.e., the primary clock path of first clock-tree 116A) and a CLK_CHK clock-tree (i.e., the shadow clock of the second clock-tree 116B). As shown in FIGS. 1A-1B, the primary clock-tree 116A is fed to the primary sub-blocks 110A, 110B (Block_0, Block_1) and lock-step checkers 118A, 118B, while the shadow clock-tree 116B is fed to the shadow sub-blocks 114A, 114B (Duplicated Block_0, Duplicated Block_1)) and lock-step checkers 118A, 118B. In some instances, this may allow for isolation of the clock-trees 116A, 116B within the sub-blocks 110A, 110B, and any faults (e.g., stuck-at faults and transient faults) on the primary clock-tree 116A within the sub-blocks 110A, 110B may be detected with the lock step checkers 118A, 118B. Since the divergent point 124A of the clock-trees 116A, 116B (from within the sub-blocks 110A, 110B) is closer to the logic convergent point 128A (i.e., from within the lockstep checkers 118A, 118B), clock-tree balancing may be simpler to achieve with optimized clock-tree buffers 122, and the lock-step checkers 118A, 118B may not need conventional clock-domain crossing (CDC) logic since the two clock-trees 116A, 116B may remain synchronous with respect to each other.

In some implementations, from the main clock-tree 108, which is fed into each sub-block 110A, 110B via the divergent point 124A, there may be common mode faults that may be seen by each sub-block 110A, 110B, and thus, the lock-step checkers 118A, 118B may not detect those faults. In this instance, there are two types of faults that may occur on common mode fault points of the main clock-tree 108. For instance, some types of faults may refer to stuck-at faults, wherein such faults on the common clock-tree 108 may be missed by the lock-step checkers 118A, 118B, since both copies of the lock-step clocks (CLK, CLK_CHK) may see the same fault. To find such faults, an improved clock checker may be used as described herein below in FIG. 2C. In another instance, some types of faults may refer to transient faults, wherein transient faults may be detected by the lock-step checkers 118A, 118B in the sub-blocks 110A, 110B since the two copies of the lock-step clocks (CLK, CLK_CHK) are temporally separated by multiple cycles (e.g., 2 cycles), and any transient fault may impact the two copies (CLK, CLK_CHK) in different stages of the pipeline creating divergence in function.

Figure 2A:
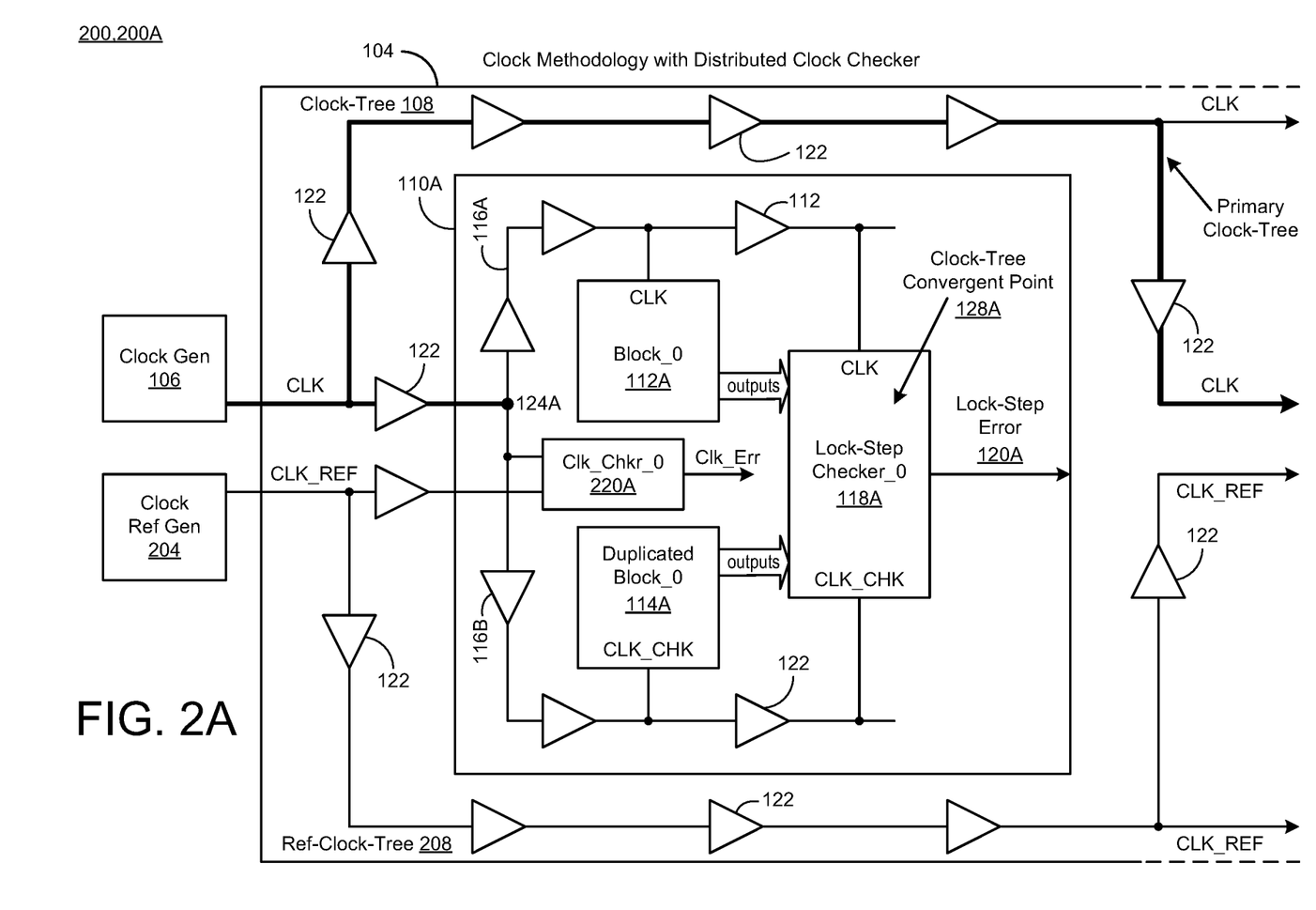
FIGS. 2A-2C illustrate another diagram of clock circuitry for functionally safe systems in accordance with various implementations described herein.
Figure 2B:
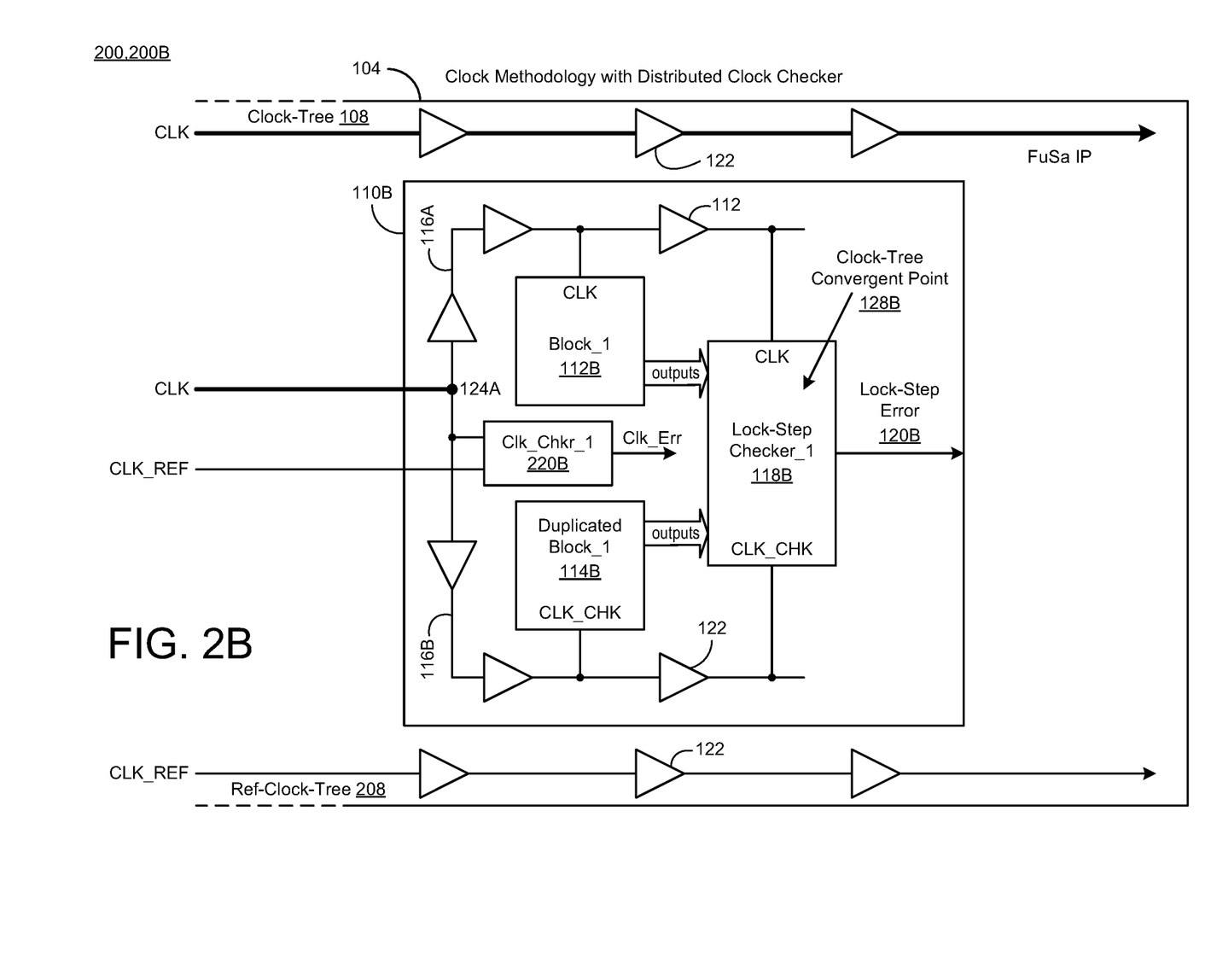
Figure 2C:
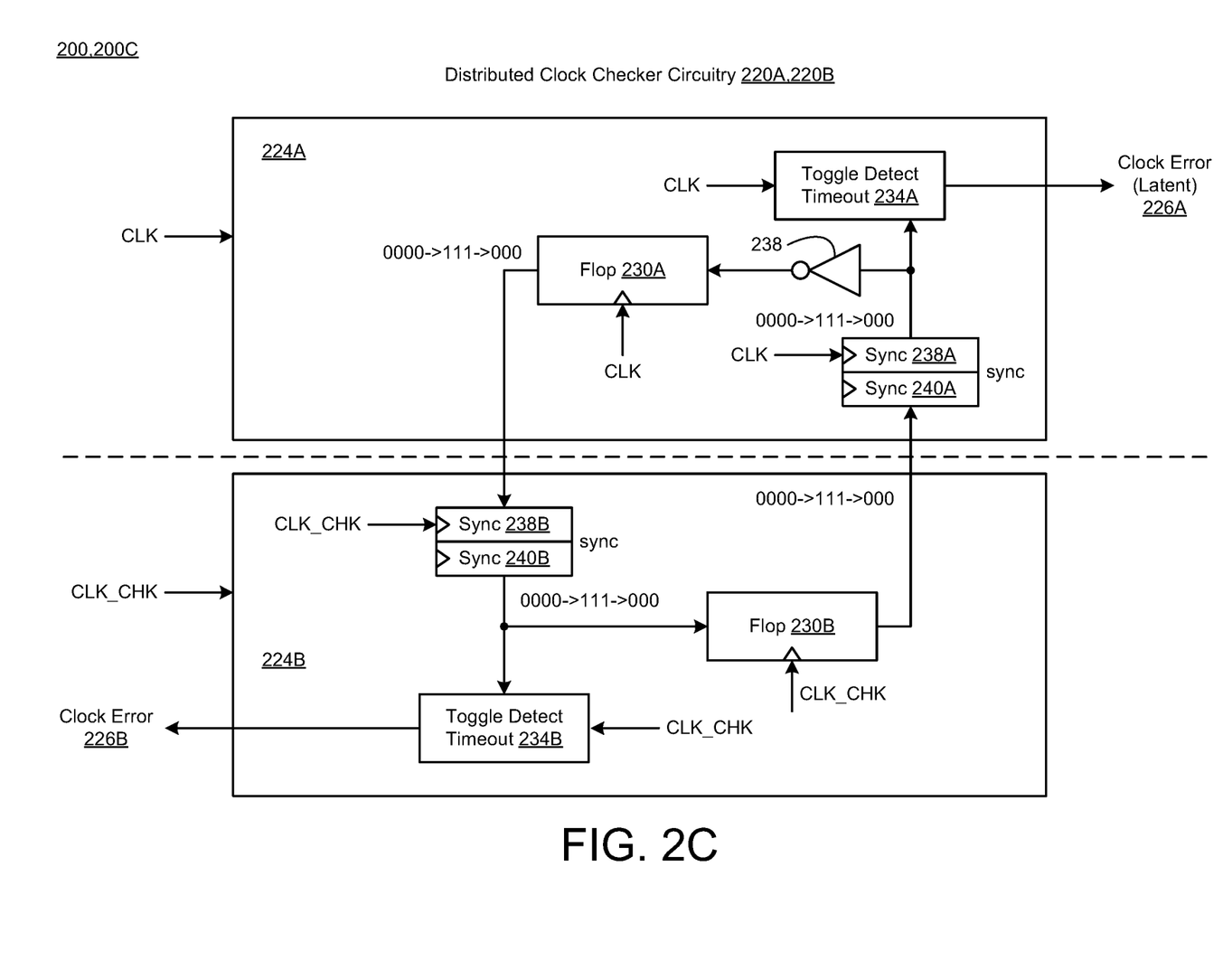

FIGS. 2A-2C illustrate a diagram of clock circuitry 200 for functionally safe (FuSa) systems in accordance with some implementations described herein. In particular, FIG. 2A shows a first part 200A of clock circuitry 200, and FIG. 2B shows a second part 200B of the clock circuitry 200 for functionally safe (FuSa) systems. Also, FIG. 2C shows distributed clock checkers 220A, 220B. The clock circuitry 200A, 200B in FIGS. 2A-2B have similar components and features as described in reference to the clock circuitry 100A, 100B of FIGS. 1A-1B.

As shown in FIGS. 2A-2B, the clock circuitry 200 may be implemented as a clock methodology having distributed clock checkers 220A, 220B that achieves improved power/area goals in a system designed to support functional safety (FuSa). The clock circuitry 200 and the various components thereof may be fabricated and implemented as an integrated circuit (IC), and as such, the clock circuitry 200 may be integrated with any type of computing circuitry and related components on a single chip. In addition, the clock circuitry 200 may be implemented in an embedded system for various types of electronic, mobile, and/or biometric applications.

The clock circuitry 200 includes the clock circuitry 106 as a main clock generator that provides the clock signal (CLK) as a main clock signal, and the clock circuitry 200 may also include a reference clock generator 204 that provides a reference clock signal (CLK_REF), wherein the reference clock signal (CLK_REF) is fully asynchronous with respect to the main clock signal (CLK). The clock circuitry 200 may include the block 104 having a block boundary, and the block 104 receives the main clock signal (CLK) from the main clock generator 106 and provides the main clock signal (CLK) along the clock-tree 108, which is referred to as a main clock-tree and/or a primary clock-tree. The block 104 receives the reference clock signal (CLK_REF) from the reference clock generator 204 and provides the reference clock signal (CLK_REF) along a reference clock-tree 208.

As shown in FIGS. 2A-2B, the clock circuitry 200 includes the plurality of sub-blocks 110A, 110B that are disposed within the block boundary of the block 104. As shown, each sub-block of the plurality of sub-blocks 110A, 110B receives the main clock signal (CLK) from within the block boundary of the block 104 via the main clock-tree 108, and each sub-block of the plurality of sub-blocks 110A, 110B receives the reference clock signal (CLK_REF) from within the block boundary of the block 104 via the reference clock-tree 208. Also, each sub-block of the plurality of sub-blocks 110A, 110B compares the main clock signal (CLK) to the reference clock signal (CLK_REF) to check for one or more errors associated with the main clock signal (CLK). In some instances, each sub-block of the plurality of sub-blocks 110A, 110B may include clock checker circuitry 220A, 220B (clk_chkr_0, clk_chkr_1) that receives the main clock signal (CLK) from the main clock generator 106 and the reference clock signal (CLK_REF) from the reference clock generator 204 and provides a clock error signal (Clk_Err). The clock checker circuitry 220A, 220B may be referred to as distributed clock checkers. Thus, in some implementations, each sub-block (e.g., 110A, 110B) of the plurality of sub-blocks may include a distributed clock checker (e.g., 220A, 220B, respectively) that receives the main clock signal (CLK), receives the reference clock signal (REF_CLK), and provides the clock error signal (clk_err).

In some implementations, each sub-block of the plurality of sub-blocks 110A, 110B may include the divergent node 124A that receives the main clock signal (CLK) from within the block boundary of the block 104 via the main clock-tree 108, and the divergent node 124A diverges the main clock signal (CLK) into the first clock signal (CLK) and the second clock signal (CLK_CHK). Also, each sub-block of the plurality of sub-blocks 110A, 110B provides the first clock signal (CLK) along the first clock-tree 116A disposed within a sub-block boundary of each sub-block 110A, 110B, and each sub-block of the plurality of sub-blocks 110A, 110B provides the second clock signal (CLK_CHK) along the second clock-tree 116B disposed within the sub-block boundary of each sub-block 110A, 110B. As shown, the first clock-tree 116A and the second clock-tree 116B are separate and isolated within each sub-block of the plurality of sub-blocks 110A, 110B from the main clock-tree 108 and the reference clock-tree 208 of the block 104.

In some implementations, as shown in FIGS. 2A-2B, there are sections of the main clock-tree 108 (bold line) where stuck-at faults may result in both copies of the sub-block clocks (e.g., in the primary clock-tree 116A and in the shadow clock-tree 116B) having the same error, and the clock circuitry 200 may miss such faults. Therefore, a novel oscillation detection circuit 200C in FIG. 2C has been developed as a clock checker to find stuck-at faults with minimum gate count and which uses an asynchronous reference clock with no frequency constraints. Advantageously, these improved distributed clock checkers 220A, 220B may be placed within each sub-block 110A, 110B.

In reference to FIG. 2C, the clock checker circuitry 220A, 220B (clk_chkr_0, clk_chkr_1) may be referred to as distributed clock checker circuitry. In some instances, the distributed clock checker circuitry 220A, 220B may include first clock checker circuitry 224A and second clock checker circuitry 224B. The first clock checker circuitry 224A may include a first toggle detect timeout circuit 234A that receives the main clock signal (CLK) and provides a first clock error signal 226A that may be latent. The second clock checker circuitry 224B may include a second toggle detect timeout circuit 234B that receives the reference clock signal (CLK_REF) as a clock check signal (CLK_CHK) and provides a second clock error signal 226B.

In some implementations, the first clock checker circuitry 224A may include a synchronizer circuit 238A, 240A (e.g., 2-stage synchronizer) that receives the main clock signal (CLK), receives a flop output signal from flop 230B from the second clock checker circuitry 224B, and provides a first synchronizer signal to an inverter 238 and the toggle detect timeout circuit 234A. The inverter 238 provides an inverted synchronizer signal to flop 230A, and the flop 230A receives the first synchronizer signal, receives the main clock signal (CLK), and provides a flop output signal to another synchronizer 238B, 240B (e.g., 2-stage synchronizer) of the second clock checker circuitry 224B. Also, the synchronizer circuit 238B, 240B receives the clock check signal (CLK_CHK), receives the flop output signal from the flop 230A of the first clock checker circuitry 224A, and provides a second synchronizer signal to the flop 230B and the second toggle detect timeout circuit 234B. The signal path of the first and second clock checker circuitry 224A, 224B operates as a phase-lock loop circuit.

As shown in FIG. 2C, the distributed clock checkers 220A, 220B implement a feedback loop with two clock domains (CLK, CLK_CHK) with the inverter 238 in the loop to stimulate digital oscillations such that if any of the clocks (CLK, CLK_CHK) are stuck, the toggle detect timeout circuits 234A, 234B fire, thereby capturing the clock errors 226A, 226B. Note that the same circuit may be used to detect stuck-at faults on the first clock-tree 116A (CLK) and the second clock-tree 116B (CLK_CHK, latent fault). Also, the toggle detect timeout circuits 234A, 234B may be implemented as a simple counter that resets to zero (0) each time it detects a toggle on the input. As such, if the counter reaches a pre-determined threshold value, then it triggers the clock errors 226A, 226B.

Figure 3A:
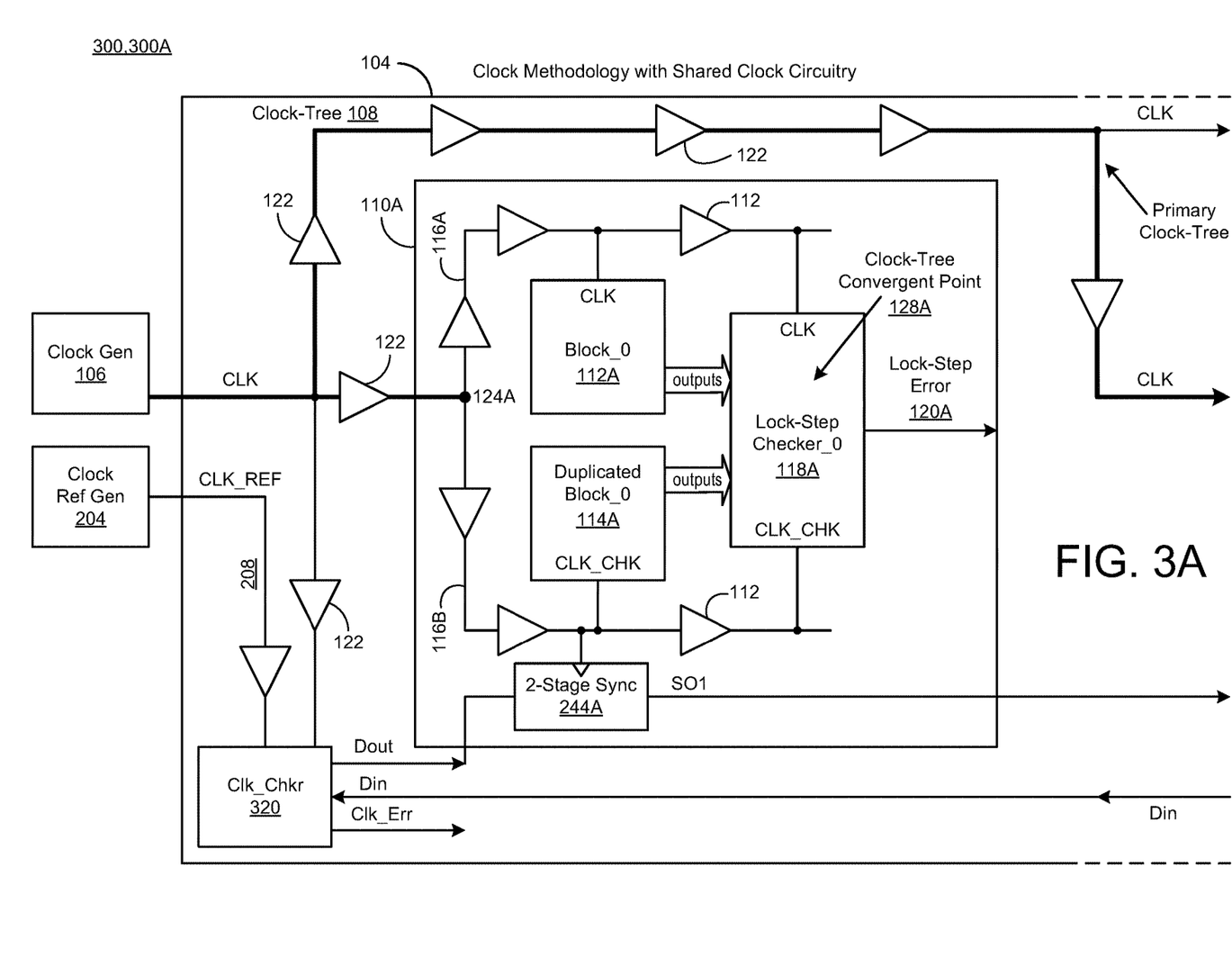
FIGS. 3A-3C illustrate another diagram of clock circuitry for functionally safe systems in accordance with various implementations described herein.
Figure 3B:
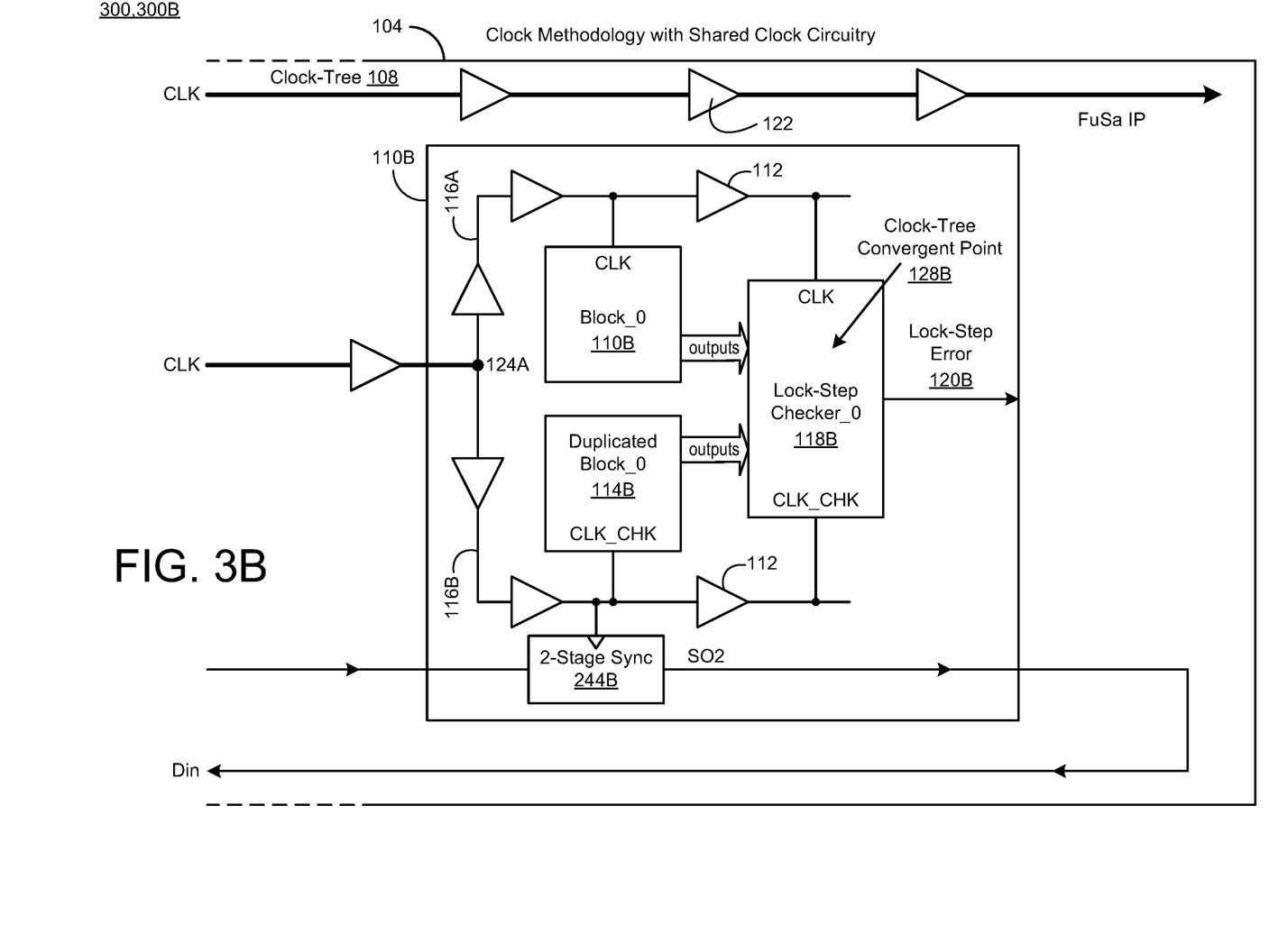
Figure 3C:
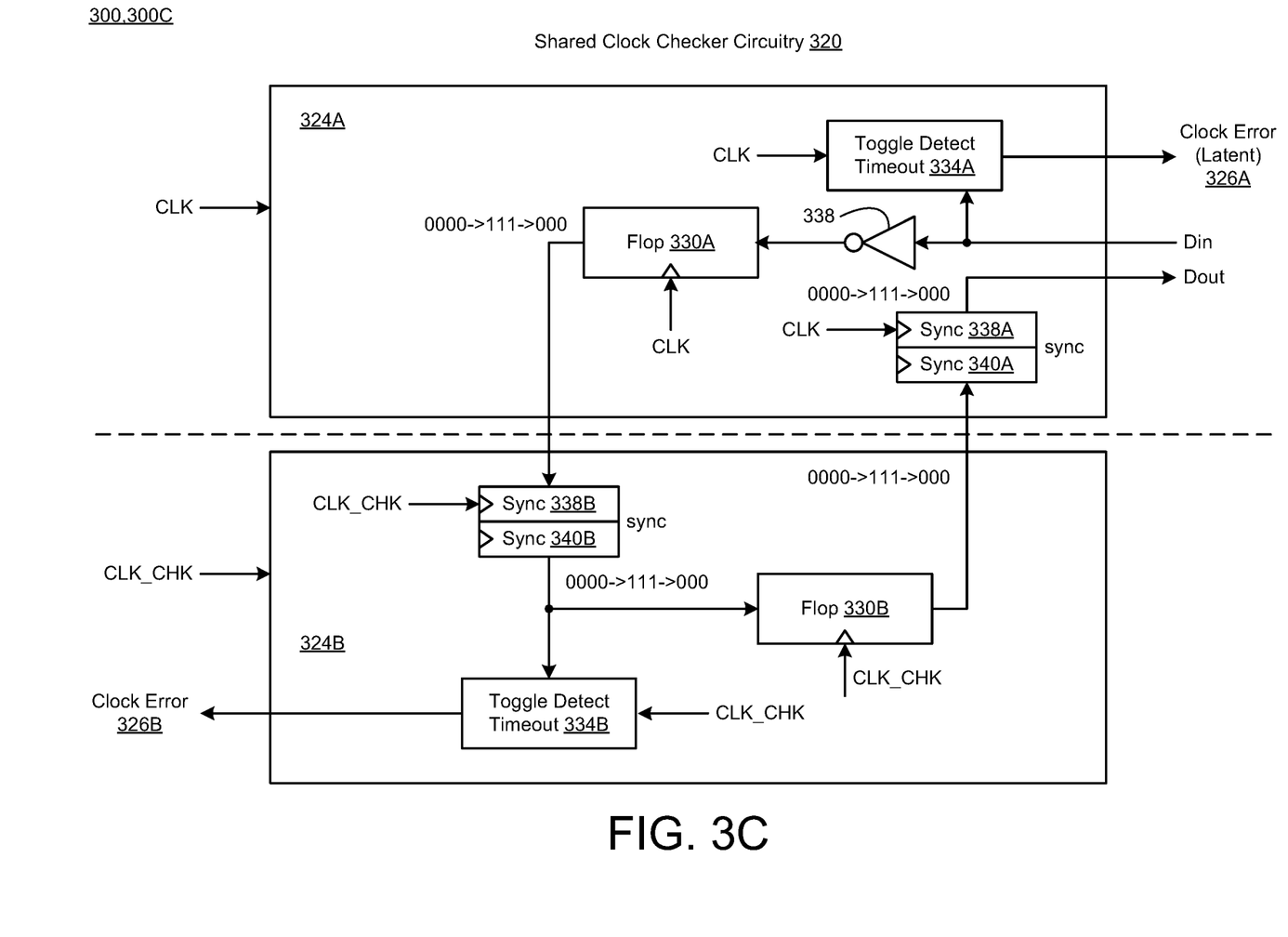

FIGS. 3A-3C illustrate another diagram of clock circuitry 300 for functionally safe (FuSa) systems in accordance with implementations described herein. In particular, FIG. 3A shows a first part 300A of clock circuitry 300, and FIG. 3B shows a second part 300B of the clock circuitry 300 for functionally safe (FuSa) systems. Also, FIG. 3C shows shared clock checker circuitry 320. The clock circuitry 300A, 300B in FIGS. 3A-3B have similar components and features as described in reference to the clock circuitry 100A, 100B of FIGS. 1A-1B and the clock circuitry 200A, 200B of FIGS. 2A-2B.

As shown in FIGS. 3A-3B, the clock circuitry 300 may be implemented as a clock methodology having shared clock checker circuitry 320 that achieves improved power/area goals in a system designed to support functional safety (FuSa). The clock circuitry 300 and the various components thereof may be fabricated and implemented as an integrated circuit (IC), and in this instance, the clock circuitry 100 may be integrated with any type of computing circuitry and related components on a single chip. In addition, the clock circuitry 100 may be implemented in an embedded system for various types of electronic, mobile, and/or biometric applications.

The clock circuitry 300 includes the main clock generator 106 that provides the main clock signal (CLK), and the clock circuitry 300 includes the reference clock generator 204 that provides the reference clock signal (CLK_REF), wherein the reference clock signal (CLK_REF) is fully asynchronous with respect to the main clock signal (CLK). The clock circuitry 300 includes the block 104 having the block boundary. The block 104 receives the main clock signal (CLK) from the main clock generator 106 and provides the main clock signal (CLK) along the main clock-tree 108. The block 104 receives the reference clock signal (CLK_REF) from the reference clock generator 204 and provides the reference clock signal (CLK_REF) along the reference clock-tree 208 to clock checker circuitry 320 (Clk_Chkr), which may be referred to as shared clock checker circuitry.

The clock circuitry 300 includes the plurality of sub-blocks 110A, 110B that are disposed within the block boundary of the block 104. In some implementations, each sub-block of the plurality of sub-blocks 110A, 110B may receive the main clock signal (CLK) from within the block boundary of the block 104 via the main clock-tree 108, and each sub-block of the plurality of sub-blocks 110A, 110B may also receive the reference clock signal (CLK_REF) from within the block boundary of the block 104 via the reference clock-tree 208. Also, each sub-block of the plurality of sub-blocks 110A, 110B may diverge the main clock signal (CLK) into the first clock signal (CLK) and the second clock signal (CLK_CHK) from within the sub-block boundary of each sub-block 110A, 110B.

As shown, the block 104 may further include the clock checker circuitry 320 that receives the main clock signal (CLK) from within the block boundary of the block 104 via the main clock-tree 108, and clock checker circuitry 320 may receive the reference clock signal (CLK_REF) from within the block boundary of the block 104 via the reference clock-tree 208. The clock checker circuitry 320 may compare the main clock signal (CLK) to the reference clock signal (CLK_REF) to check for one or more errors (Clk_Err) associated with the main clock signal (CLK). In some implementations, the clock checker circuitry 320 receives the main clock signal (CLK) from the main clock generator 106 via the main clock-tree 108, and the clock checker circuitry 320 receives the reference clock signal (CLK_REF) from the reference clock generator 204 via the reference clock-tree 208. Also, the clock checker circuitry 320 receives a data input signal (Din) and provides a data output signal (Dout) and the clock error signal (Clk_Err). In this instance, each sub-block of the plurality of sub-blocks 110A, 110B includes a 2-stage synchronizer 244A, 244B that receives the data output signal (Dout) from the clock checker circuitry 320, receives the second clock signal (CLK_CHK) from each corresponding sub-block 110A, 110B and provides a data output signal (SO1, SO2), respectively. The data output signals (SO1, SO2) may be referred to as sync output (SO) signals. As shown, the last sub-block (e.g., 244B) in the sub-block chain provides its data output signal to the clock checker circuitry 320 as the data input signal (Din). In some instances, the sync output signal (SO2) is the same as the data input signal (Din).

In some implementations, as shown in FIGS. 3A-3B, another variant of the clock methodology of FIGS. 1A-1B may refer to situations where the main clock signal (CLK) is routed through the sub-blocks 110A, 110B and forked-off within the sub-blocks 110A, 110B at the divergent point 124A. For instance, one difference is that the clock checkers 220A, 220B (as shown in FIGS. 2A-2B) are not distributed in each sub-block 110A, 110B but instead there may be a single shared clock checker 320 (as shown in FIGS. 3A-3B) present in block 104, and it may detect some stuck-at faults for the common mode clock-tree 116A by creating a daisy-chain of synchronisers 244A, 244B that pass through each sub-block 110A, 110B as shown in FIGS. 3A-3B.

In some implementations, the shared clock checker 320 receives the main clock signal (CLK) from the clock generator 106, receives the reference clock signal (REF_CLK) from the clock reference generator 204, receives the data input signal (Din), provides the clock error signal (Clk_Err), and provides the data output signal (Dout). The first sub-block 110A of the plurality of sub-blocks includes a first (or initial) synchronizer 244A that receives the data output signal (Dout) from the shared clock checker 320 and provides the first sync output signal (SO1). The second sub-block 110B of the plurality of sub-blocks includes a second (or last) synchronizer 244B that receives the first sync output signal (SO1) from the first synchronizer 244A and provides the second sync output signal (SO2) to the shared clock checker 320 as the data input signal (Din).

In reference to FIG. 3C, the clock checker circuitry 320 (clk_chkr) may be referred to as shared clock checker circuitry. In some instances, the shared clock checker circuitry 320 may include first clock checker circuitry 324A and second clock checker circuitry 324B. The first clock checker circuitry 324A may include a first toggle detect timeout circuit 334A that receives the main clock signal (CLK), receives the data input signal (Din), and provides a first clock error signal 326A that may be latent. Also, the second clock checker circuitry 324B may include a second toggle detect timeout circuit 334B that receives the reference clock signal (CLK_REF) as a clock check signal (CLK_CHK) and provides a second clock error signal 326B.

In some implementations, the first clock checker circuitry 324A may include a synchronizer circuit 338A, 340A (e.g., 2-stage synchronizer) that receives the main clock signal (CLK), receives a flop output signal from flop 330B from the second clock checker circuitry 324B, and provides the data output signal (Dout). The inverter 338 receives the data input signal (Din) and provides an inverted data input signal to flop 330A, and the flop 330A receives the inverted data input signal from the inverter 338, receives the main clock signal (CLK), and provides a flop output signal to another synchronizer 338B, 340B (e.g., 2-stage synchronizer) of the second clock checker circuitry 324B. In addition, the synchronizer circuit 338B, 340B receives the clock check signal (CLK_CHK), receives the flop output signal from the flop 330A of the first clock checker circuitry 324A, and provides a synchronizer signal to the flop 330B and the second toggle detect timeout circuit 334B. The signal path of the first and second clock checker circuitry 324A, 324B operates as a phase-lock loop circuit.

As shown in FIG. 3C, the shared clock checker 320 is similar to the distributed clock checkers 220A, 220B, except that the feedback loop passes through each sub-block 110A, 110B using a daisy-chain configuration. In some instances, when there is a stuck-at fault on the common mode fault tree 116A, that fault may appear in at least one sub-block 110A, 110B, and this occurrence may block the toggle signal from reaching the data input (Din), which may trigger one or more of the clock errors 326A, 326B.

Some advantages of various schemes and techniques described herein refer to one or more of the following. For instance, in reference to power/area savings on the clock-tree, various schemes and techniques described herein facilitate improved clock-tree balancing since two clock-trees are diverging within each sub-block boundary. Also, the various schemes and techniques described herein enable more optimized clock-tree buffers, which provides for improved power/area metrics without compromising diagnostic coverage for clock-tree faults. In reference to faster turnaround time on clock-tree balancing, various schemes and techniques described herein facilitate simpler clock-tree synthesis and turnaround time for clock-tree balancing that is much less as compared to full duplication of the clock-tree with divergent point outside of the system block. Also, in reference to the absence of CDC logic in the lock-step checker, the various schemes and techniques described herein utilize two clock-trees (e.g., primary and shadow) that may be balanced within the sub-blocks, and as such, there is no need for CDC logic in the lock-step checker since the two clocks are synchronous. Thus, various schemes and techniques described herein provide for use of simpler lock-step checkers with improved power/area metrics. Generally, these advantages are achieved without compromising on diagnostics coverage for clock-tree faults.

Described herein are various implementations of an integrated circuit. The integrated circuit may include a clock generator providing a clock signal. The integrated circuit may include a block having a block boundary, and the block receives the clock signal from the clock generator and provides the clock signal along a clock-tree. The integrated circuit may include a plurality of sub-blocks disposed within the block boundary of the block, and each sub-block of the plurality of sub-blocks receives the clock signal from within the block boundary of the block via the clock-tree, and diverges the clock signal into a first clock signal and a second clock signal from within a sub-block boundary of each sub-block.

Described herein are various implementations of an integrated circuit. The integrated circuit may include a main clock generator providing a main clock signal and a reference clock generator providing a reference clock signal. The integrated circuit may include a block having a block boundary, and the block receives the main clock signal from the main clock generator and provides the main clock signal along a main clock-tree, and receives the reference clock signal from the reference clock generator and provides the reference clock signal along a reference clock-tree. The integrated circuit may include a plurality of sub-blocks disposed within the block boundary of the block, and each sub-block of the plurality of sub-blocks receives the main clock signal from within the block boundary of the block via the main clock-tree, receives the reference clock signal from within the block boundary of the block via the reference clock-tree, and compares the main clock signal to the reference clock signal so as to check for one or more errors associated with the main clock signal.

Described herein are various implementations of an integrated circuit. The integrated circuit may include a main clock generator providing a main clock signal and a reference clock generator providing a reference clock signal. The integrated circuit may include a block having a block boundary, and the block receives the main clock signal from the main clock generator and provides the main clock signal along a main clock-tree, and receives the reference clock signal from the reference clock generator and provides the reference clock signal along a reference clock-tree. The integrated circuit may include a plurality of sub-blocks disposed within the block boundary of the block, and each sub-block of the plurality of sub-blocks receives the main clock signal from within the block boundary of the block via the main clock-tree, receives the reference clock signal from within the block boundary of the block via the reference clock-tree, and diverges the main clock signal into a first clock signal and a second clock signal from within a sub-block boundary of each sub-block. The block includes a clock checker that receives the main clock signal from within the block boundary of the block via the main clock-tree, receives the reference clock signal from within the block boundary of the block via the reference clock-tree, and compares the main clock signal to the reference clock signal so as to check for one or more errors associated with the main clock signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower";

"upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a clock generator providing a clock signal;
   a block having a block boundary, wherein the block receives the clock signal from the clock generator and provides the clock signal along a clock-tree; and
   a plurality of sub-blocks disposed within the block boundary of the block, wherein each sub-block of the plurality of sub-blocks comprises:
      first block circuitry and second block circuitry, wherein the first block circuitry is configured to receive a first clock signal and provide one or more first output signals based on the first clock signal, and wherein the second block circuitry is configured to receive a second clock signal and provide one or more first and second output signals based on the second clock signal; and
      lock-step checker circuitry configured to provide a lock-step error signal based on the first and second clock signals and the one or more first and second output signals.

2. The integrated circuit of claim 1, wherein the block comprises functional safety (FuSa) block circuitry that provides the clock signal along the clock-tree to each sub-block of the plurality of sub-blocks.

3. The integrated circuit of claim 1, wherein the clock-tree comprises a main clock-tree that is disposed within the block boundary of the block, and wherein the main clock-tree feeds the clock signal to each sub-block of the plurality of sub-blocks.

4. The integrated circuit of claim 1, wherein each sub-block of the plurality of sub-blocks has a divergent node that receives the clock signal from within the block boundary of the block via the clock-tree and diverges the clock signal into the first clock signal and the second clock signal.

5. The integrated circuit of claim 1, wherein each sub-block of the plurality of sub-blocks provides the first clock signal along a first clock-tree disposed within a sub-block boundary of each sub-block, and wherein each sub-block of the plurality of sub-blocks provides the second clock signal along a second clock-tree disposed within the sub-block boundary of each sub-block.

6. The integrated circuit of claim 5, wherein the first clock-tree and the second clock-tree are separate and isolated within each sub-block of the plurality of sub-blocks from the clock-tree of the block.

7. The integrated circuit of claim 5, wherein the first clock-tree distributes the first clock signal to the first block circuitry disposed within each sub-block of the plurality of sub-blocks, and wherein the second clock-tree distributes the second clock signal to second block circuitry disposed within each sub-block of the plurality of sub-blocks.

8. The integrated circuit of claim 7, wherein the second block circuitry is a duplicate of the first block circuitry.

9. The integrated circuit of claim 5, wherein the first block circuitry receives the first clock signal from the first clock-tree, and wherein the second block circuitry receives the second clock signal from the second clock-tree.

10. The integrated circuit of claim 9, wherein the lock-step checker circuitry receives the first clock signal from the first clock tree and receives the second clock signal from the second clock tree.

11. The integrated circuit of claim 10, wherein the lock-step checker circuitry operates as a logical point of convergence, and wherein one or more faults occurring on the first clock-tree within each sub-block are detected by the lock-step checker circuitry.

12. The integrated circuit of claim 11, wherein the one or more faults comprise a stuck-at fault that refers to a stuck-at clock error related to the clock signal not toggling and being stuck at a logic value of 1 or 0.

13. The integrated circuit of claim 12, wherein the one or more faults comprises a transient fault that refers to a transient clock error related to an extra edge on the clock signal or a transient clock error related to a missed edge on the clock signal.

14. The integrated circuit of claim 1, wherein each sub-block of the plurality of sub-blocks receives the clock signal from within the block boundary of the block via the clock-tree, and diverges the clock signal into the first clock signal and the second clock signal from within a sub-block boundary of each sub-block.

15. An integrated circuit, comprising:
   a main clock generator providing a main clock signal;
   a reference clock generator providing a reference clock signal;
   a block having a block boundary, wherein the block
      receives the main clock signal from the main clock generator and provides the main clock signal along a main clock-tree, and
      receives the reference clock signal from the reference clock generator and provides the reference clock signal along a reference clock-tree; and
   a plurality of sub-blocks disposed within the block boundary of the block, wherein each sub-block of the plurality of sub-blocks,
      receives the main clock signal from within the block boundary of the block via the main clock-tree, and
      receives the reference clock signal from within the block boundary of the block via the reference clock-tree, and
      compares the main clock signal to the reference clock signal so as to check for one or more errors associated with the main clock signal.

16. The integrated circuit of claim 15, wherein the reference clock signal is asynchronous with respect to the main clock signal.

17. The integrated circuit of claim 15, wherein each sub-block of the plurality of sub-blocks has a divergent node that receives the main clock signal from within the block boundary of the block via the main clock-tree and diverges the main clock signal into a first clock signal and a second clock signal.

18. The integrated circuit of claim 17, wherein each sub-block of the plurality of sub-blocks provides the first clock signal along a first clock-tree disposed within a sub-block boundary of each sub-block, and wherein each sub-block of the plurality of sub-blocks provides the second clock signal along a second clock-tree disposed within the sub-block boundary of each sub-block.

19. The integrated circuit of claim 18, wherein the first clock-tree and the second clock-tree are separate and isolated within each sub-block of the plurality of sub-blocks from the main clock-tree and the reference clock-tree of the block.

20. The integrated circuit of claim 18, wherein the first clock-tree distributes the first clock signal to first block circuitry disposed within each sub-block of the plurality of sub-blocks, and wherein the second clock-tree distributes the second clock signal to second block circuitry disposed within each sub-block of the plurality of sub-blocks.

21. The integrated circuit of claim 18, wherein each sub-block of the plurality of sub-blocks has first block circuitry and second block circuitry, wherein the first block circuitry receives the first clock signal from the first clock-tree and provides one or more first output signals based on the first clock signal, and wherein the second block circuitry receives the second clock signal from the second clock-tree and provides one or more second output signals based on the second clock signal.

22. The integrated circuit of claim 21, wherein each sub-block of the plurality of sub-blocks has lock-step checker circuitry that receives the first clock signal from the first clock-tree, receives the one or more first output signals from the first block circuitry, receives the second clock signal from the second clock-tree, receives the one or more second output signals from the second block circuitry, and provides a lock-step error signal based on the first clock signal, the one or more first output signals, the second clock signal, and the one or more second output signals.

23. The integrated circuit of claim 15, wherein each sub-block of the plurality of sub-blocks has a distributed clock checker that receives the main clock signal, receives the reference clock signal, and provides a clock error signal.

24. An integrated circuit, comprising:
a main clock generator providing a main clock signal;
a reference clock generator providing a reference clock signal;
a block having a block boundary, wherein the block:
   receives the main clock signal from the main clock generator and provides the main clock signal along a main clock-tree, and
   receives the reference clock signal from the reference clock generator and provides the reference clock signal along a reference clock-tree; and
a plurality of sub-blocks disposed within the block boundary of the block, wherein each sub-block of the plurality of sub-blocks:
   receives the main clock signal from within the block boundary of the block via the main clock-tree,
   receives the reference clock signal from within the block boundary of the block via the reference clock-tree, and
   diverges the main clock signal into a first clock signal and a second clock signal from within a sub-block boundary of each sub-block,
wherein the block further comprises a clock checker that:
   receives the main clock signal from within the block boundary of the block via the main clock-tree,
   receives the reference clock signal from within the block boundary of the block via the reference clock-tree, and
   compares the main clock signal to the reference clock signal so as to check for one or more errors associated with the main clock signal.

25. The integrated circuit of claim 24, wherein the reference clock signal is asynchronous with respect to the main clock signal.

26. The integrated circuit of claim 24, further comprising:
a shared clock checker that receives the main clock signal, receives the reference clock signal, receives a data input signal, provides a clock error signal, and provides a data output signal,
wherein a first sub-block of the plurality of sub-blocks includes a first synchronizer that receives the data output signal from the shared clock checker and provides a first sync output signal, and
wherein a second sub-block of the plurality of sub-blocks includes a second synchronizer that receives the first sync output signal from the first synchronizer and provides a second sync output signal to the shared clock checker as the data input signal.

* * * * *